United States Patent [19]

Butler

[11] 4,051,270
[45] Sept. 27, 1977

[54] METHOD OF MEASURING VAPOR DEPOSITED COATING THICKNESS

[75] Inventor: John F. Butler, Bethel Park, Pa.

[73] Assignee: Jones & Laughlin Steel Corporation, Pittsburgh, Pa.

[21] Appl. No.: 296,419

[22] Filed: Oct. 10, 1972

Related U.S. Application Data

[63] Continuation of Ser. No. 813,790, Feb. 18, 1969, abandoned, which is a continuation-in-part of Ser. No. 540,705, April 6, 1966, abandoned.

[51] Int. Cl.$^2$ .................. C23C 13/00; C23C 13/02
[52] U.S. Cl. .................................. 427/8; 427/9; 427/10; 427/250; 427/251; 427/294; 427/295; 118/4; 118/5; 118/6; 118/7; 118/8; 118/9; 73/340; 73/341; 73/351; 73/355 R
[58] Field of Search ............ 117/107.1; 118/4–9; 73/340, 341, 351, 355; 427/8–10, 250, 251, 294, 295

[56] References Cited

U.S. PATENT DOCUMENTS

| | | | |
|---|---|---|---|
| 2,545,576 | 3/1951 | Godley | 117/107.1 X |
| 2,665,224 | 1/1954 | Clough et al. | 117/107 |
| 2,812,270 | 11/1957 | Alexander | 117/107.1 X |
| 3,016,732 | 1/1962 | Hanysz et al. | 73/341 X |
| 3,455,730 | 7/1969 | Gimigliano | 117/107.1 |

*Primary Examiner*—Harris A. Pitlick
*Attorney, Agent, or Firm*—Gerald K. White; T. A. Zalenski

[57] ABSTRACT

The temperature of a substrate to be vacuum vapor coated is measured immediately before its is passed over a source of coating metal vapor and immediately after the vapor has condensed on it. Costing conditions are controlled to maintain the difference between those temperatures at a value which is related to the thickness of the condensed coating by a heat balance equation.

13 Claims, 4 Drawing Figures

METHOD OF MEASURING VAPOR DEPOSITED COATING THICKNESS

This is a continuation, of application Ser. No. 813,790 filed Feb. 18, 1969, now abandoned, which in turn is a continuation-in-part of my application Ser. No. 540,705, filed Apr. 6, 1966, and now abandoned.

This invention is concerned with methods for the measurement and control of the thickness of metal coatings deposited from their vapors on metal substrates. It is more particularly concerned with indirect methods for such measurement and control based on temperature measurement.

It is known to coat a metal substrate with another metal by vaporizing the latter in an evacuated chamber and causing it to deposit or condense on the substrate, and it is known to coat continuously in this way by passing the substrate in the form of strip continuously through the evacuated chamber over or adjacent a source of coating metal vapor. The source of coating metal vapor is conventionally a crucible heated electrically or by an electron beam. It is also known to use a plurality of sources arranged adjacent each other across the width of the substrate so that each source supplies metal vapor to a separate portion of the substrate.

It is an object of my invention to provide an indirect method of determining the thickness of a vapor-deposited metal coating immediately after the coating has been formed. It is another object to provide such a method which can be practiced inside the evacuated chamber. It is another object to provide such a method based on temperature measurement of the substrate. It is yet another object to provide a method as above-described suitable for maintaining constant the thickness of a continuously deposited coating. It is still another object to provide a method as above-described for maintaining a desired coating thickness profile across the substrate. Other objects of my invention will appear from the description thereof which follows.

I have found that the temperature of the substrate increases as the coating metal deposits or condenses thereon, and that for substrates over a rather extensive range of thicknesses of commercial importance, the difference between substrate temperatures after and before coating is linearly related to the coating thickness.

BRIEF DESCRIPTION OF THE DRAWINGS

Embodiments of my invention presently preferred by me are illustrated in the attached Figures to which reference is now made.

While my invention is broadly applicable to the vapor coating of any metal on any metal substrate, it is specifically adapted to the vapor coating of steel strip of thickness less than about 0.05 inch with other metals which can be deposited without heating the substrate over about 1000° F. My methods involve essentially steady state temperature measurements and under the conditions above-mentioned temperature equilibrium through the thickness of the substrate is reached in less than 0.1 second and the heat loss from the substrate in the near-vacuum of the coating chamber is negligible. The coating metals of greatest commercial importance, aluminum and zinc, can be vapor deposited below the temperature above set out. In this application, I refer to metal substrates of less than 0.05 inch thickness as thin substrates.

Figure 1:
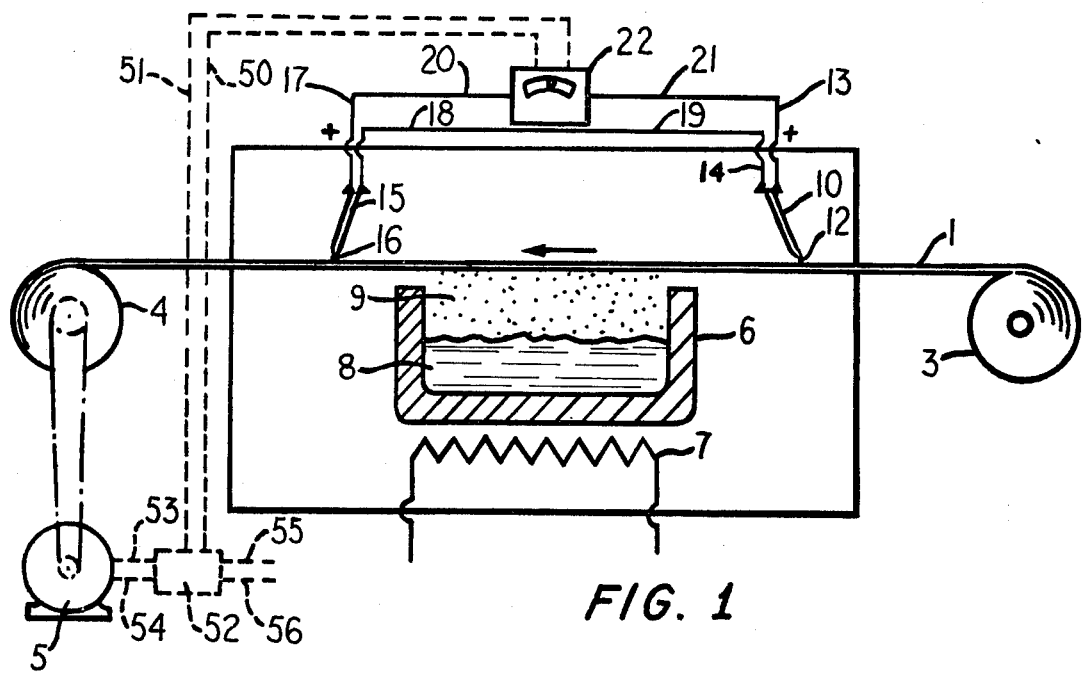
FIG. 1 is a schematic sketch of apparatus arranged to practice one embodiment of my invention.

In FIG. 1 the substrate 1 in the form of strip is passed horizontally through an evacuated chamber 2 from an uncoiling reel 3 to a coiling reel 4. Reel 4 is driven by an electric motor 5. Within chamber 2 and disposed below the path of travel of substrate 1 is a crucible 6 provided with electrical heating means 7. In crucible 6 is maintained a pool of liquid coating metal 8 which gives off vapor 9 at its surface.

A first thermocouple 10 is positioned in chamber 2 with its hot junction 12 in contact with the upper surface of substrate 1 immediately upstream of crucible 6. Thermocouple 10 has a positive lead 13 and a negative lead 14 extending outside chamber 2. A second thermocouple 15 is positioned in chamber 2 with its hot junction 16 in contact with the upper surface of substrate 1 immediately downstream of crucible 6. Thermocouple 16 has a positive lead 17 and a negative lead 18 extending outside chamber 2. Negative lead 14 of thermocouple 10 is connected to negative lead 18 of thermocouple 15 by conductor 19. Positive lead 13 of thermocouple 10 is connected to one terminal of meter 22 by conductor 21, and positive lead 17 of thermocouple 15 is connected to the other terminal of meter 22 by conductor 20.

In the apparatus above-described, vapor 9 impinges on the undersurface of substrate 1 and condenses thereon. As the vapor condenses, it gives off heat and so heats the substrate 1 as it passes over crucible 6. Thermocouple 10 makes contact at its hot junction 12 with moving substrate 1 and generates a current which tends to flow from its positive lead 13 toward its negative lead 14. Thermocouple 15 likewise measures the increased temperature of the substrate 1 after it is passed over crucible 6 and generates a current which tends to flow from its positive lead 17 toward its negative lead 18. The two thermocouples 10 and 15 are connected to meter 22 in bucking or opposing fashion, so that meter 22 reads the difference between the currents generated by the two thermocouples and so indicates the temperature difference between the substrate 1 before coating and the same substrate after coating. This temperature difference is directly proportional to the coating thickness, as will be shown. In this way, I measure the thickness of the coating deposited on substrate 1 by the difference between the two temperature measurements of substrate 1 which are carried out inside vacuum chamber 2.

Electric motor 5 is, of course, connected to a source of electric power, not shown. In a modification of my invention shown in broken lines the current measured by meter 22 is passed through conductors 50 and 51 to conventional control apparatus 52 interposed between the source of electric power and motor 5. Control apparatus 52 is connected to motor 5 by conductors 53 and 54, and to a source of electric power by conductors 55 and 56. Control apparatus 52 varies the voltage applied to motor 5 in response to the current supplied through conductors 50 and 51. In this way the speed of travel of substrate 1 is adjusted to maintain constant the difference in temperature measured by thermocouples 10 and 15, and so maintains constant the thickness of the metal coating deposited on substrate 1.

Figure 2:
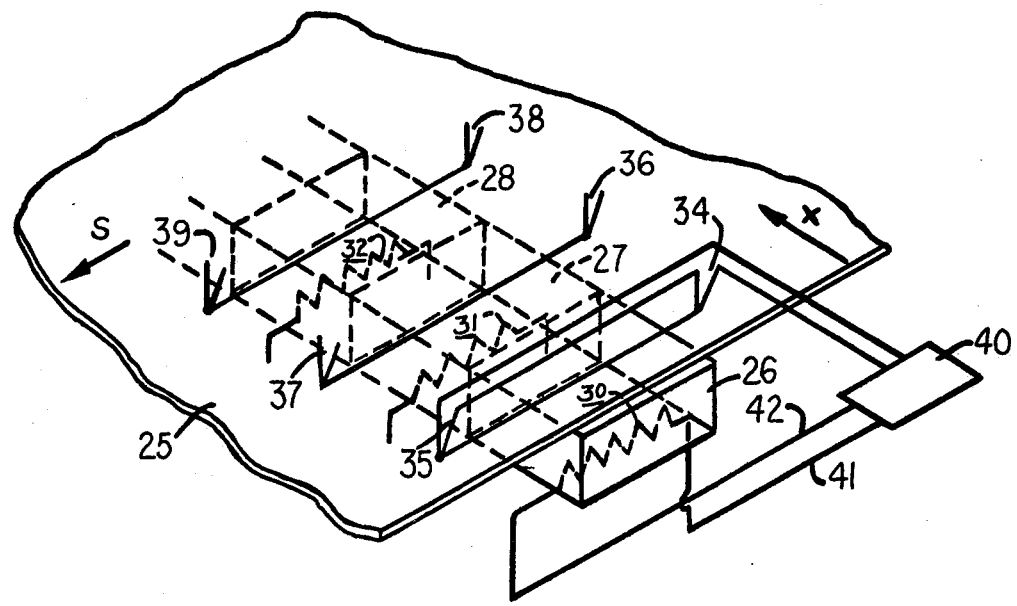
FIG. 2 is a schematic sketch partly in perspective of a portion of apparatus arranged to practice another embodiment of my invention.

In FIG. 2 is illustrated a portion of a wide substrate 25 which passes over crucibles 26, 27, and 28 arranged side-by-side transversely of its path of travel. Crucible 26 is provided with a heating element 30, crucible 27 is provided with heating element 31, and crucible 28 is provided with heating element 32. Upstream of crucible 26 is positioned a thermocouple 34 making contact with that portion of the substrate 25 above crucible 26. Downstream of crucible 26 is positioned a thermocouple 35 making contact with that portion of the substrate 25 above crucible 26. Similar thermocouples 36 and 37 are positioned in like manner with respect to crucible 27 and similar thermocouples 38 and 39 with respect to crucible 38. Thermocouples 34 and 35 are connected in bucking or opposing relation to a conventional control device 40 through which electric power is applied to heating element 30 through leads 41 and 42. Thermocouples 36 and 37 are likewise connected to a similar device, not shown, adapted to control the power to heating element 31, and thermocouples 38 and 39 are connected in the same way to yet another like device, not shown, adapted to control the power supplied to heating element 32.

The difference in temperature between thermocouples 34 and 35 controls the power supplied to heating element 30 of crucible 26 in a way similar to that in which the difference in temperature between thermocouples 10 and 15 controls the power supplied motor 5 of FIG. 1. Likewise the corresponding thermocouples 36 and 37, and 38 and 39 control the power supplied to heating elements 31 and 32 of crucibles 27 and 28, respectively. In this way the temperature differences across the coatings deposited on the substrate immediately adjacent to crucibles 26, 27, and 28 are controlled to maintain equal thickness or any desired ratio of thicknesses.

Figure 3:
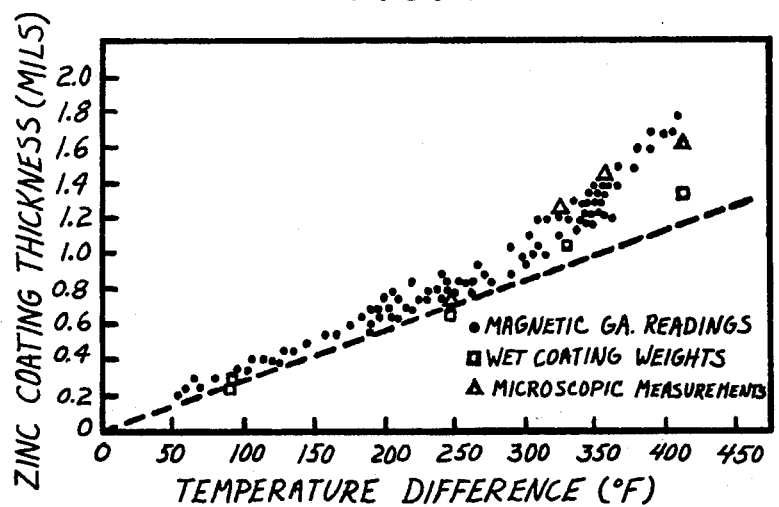
FIG. 3 is a graph showing the relation between the temperature difference abovementioned and the coating thickness for a zinc coating on a steel substrate.

FIG. 3 is a graph of coating thickness of a zinc coating vapor-deposited on steel strip of 0.018 inch thickness by the process of my invention. The various points of the graph are thickness measurements obtained by three different methods, as are indicated in the Figure. The solid circles indicate coating thicknesses obtained by a magnetic gauge. The squares indicate coating weights obtained by weight difference of the substrate before and after the coating is dissolved chemically. The triangles indicate coating thicknesses obtained by measurements of photo-micrographs. It will be observed that for temperature differences up to the range of 300° to 350° F., the relation between coating thicknesses and temperature is quite linear. For greater coating thicknesses the points depart somewhat from the broken straight line, which is the calculated relation. It is believed that this departure is more apparent than real. The process of my invention actually measures the weight of the metal deposited, which for a considerable range of coating thicknesses corresponds exactly with the thickness. However, in thicker coatings, voids are found, so that coating weight cannot be converted into coating thickness merely by dividing weight by the nominal density of the coating metal.

The relation between coating thickness and the difference between the temperature of the substrate immediately after coating and immediately before coating is calculated from a heat balance derived for a system comprising 1 square inch of sheet metal substrate coated on one side with a coating metal. In this derivation the terms employed are defined as follows:

$T_o$ = initial temperature of substrate, degrees F.
$T_f$ = final temperature of substrate, degrees F.
$T_c$ = temperature of condensation of coating material, degrees F.
$C_{st}$ = average heat capacity of substrate for temperatures between $T_o$ and $T_f$, BTU's per pound per degree F.
$C_k$ = heat of condensaton of coating metal at $T_c$, BTU's per pound
$C_c$ = average heat capacity of solid coating metal for temperatures between $T_f$ and $T_c$, BTU's per pound per degree F.
$\rho_{st}$ = density of substrate, pounds per cubic inch
$\rho_c$ = density of coating metal, pounds per cubic inch
$V_{st}$ = volume of substrate, cubic inches
$V_c$ = volume of coating metal, cubic inches
$t_{st}$ = thickness of substrate in mils. For one square inch of substrate $t_{st} = V_c \times 1000$ $t_c$ = thickness of coating metal in mils. For one square inch of coating metal $t_c = V_c \times 1000$ The heat balance is expressed as follows:

$$\Delta H_{substrate}(T_o \text{ to } T_f) = \Delta H_{condensation}(T_c) + \Delta H_{condensate}(T_c \text{ to } T_f) \tag{1}$$
$$\Delta H_{substrate}(T_o \text{ to } T_f) = C_{st}(T_f - T_o)\rho_{st} V_{st} \tag{2}$$
$$\Delta H_{condensation}(T_c) = C_k \rho_c V_c \tag{3}$$
$$\Delta H_{condensate}(T_c \text{ to } T_f) = C_c(T_c - T_f)\rho_c V_c \tag{4}$$

Substituting equations (2), (3), and (4) into equation (1) gives:

$$C_{st}(T_f - T_o)\rho_{st} V_{st} = C_k \rho_c V_c + C_c(T_c - T_f)\rho_c V_c \tag{5}$$

Expressing volume in terms of thickness gives:

$$C_{st}(T_f - T_o)\rho_{st}\frac{t_{st}}{1000} = C_k \frac{\rho_c t_c}{1000} + C_c(T_c - T_f)\frac{\rho_c t_c}{1000} \tag{6}$$

$$t_c = \frac{C_{st}(T_f - T_o)\rho_{st} t_{st}}{\rho_c[C_k + C_c(T_c - T_f)]} \tag{7}$$

The term $C_k$ in the denominator of equation (7) is much larger than the term $c_c(T_c - T_f)$. Therefore, $T_f$ in the denominator can be considered to be constant at an average value of final substrate temperature without introducing significant error in $t_c$. Equation (7) shows therefore that $t_c$ is directly proportional to the temperature difference between the substrate temperature after coating and its temperature before coating.

Where the substrate is steel:
$C_{st}$ = 0.120 BTU/lb.° F.
$\rho_{st}$ = 0.284 lb./in.³

Where the coating metal is zinc:
$T_c$ = 1000° F.
$C_k$ = 796 BTU/lb.
$C_c$ = 0.105 BTU/lb./° F.
$\rho_c$ = 0.258 lb./in.³

Substituting the terms above defined in equation (7) gives:

$$t_{Zn} = \frac{.120 \times (T_f - T_o) \times .284 \times t_{st}}{.258 \times [796 + .105(1000 - T_f)]} \tag{8}$$

An average value of $T_f$ for substitution in the denominator of (8) is 400° F. The equation then becomes:

$$t_{Zn} = \frac{.120(T_f - T_o).284\, t_{st}}{.258[796 + .105 \times 600]} \tag{9}$$

$$t_{Zn} = 1.55 \, (T_f - T_o) \, t_{st} \times 10^{-4} \quad (10)$$

Where the coating metal is aluminum:
$T_c = 2700°$ F.
$C_k = 4815$ BTU/lb.
$C_c = 0.299$ BTU/lb.F.
$\rho_c = 0.0975$ lb./in.$^3$ As vacuum vapor deposited aluminum coatings are much thinner than vacuum vapor deposited zinc coatings, it is more convenient to express the coating thickness, $t_c$, in microinches. For one square inch of coating, $t_c$ in microinches $= V_c \times 10^6$. The equation for aluminum coatings on steel using the above constants and again assuming an average value of $T_f$ of 400° F. in the denominator is:

$$t_{Al} = 6.35 \, (T_f - T_o) \, t_{st} \times 10^{-2} \quad (11)$$

Certain assumptions were made to simplify calculation of the foregoing heat balance. The specific heat $C_{st}$ of the substrate varies somewhat with its temperature so that the use of an average value introduces small errors at both extremes of the temperature range. The heat balance disregards the heating of the substrate by radiation from the coating metal source and so will be somewhat in error for extreme conditions of coating, i.e., slow travel of substrate over a coating metal source at a high temperature.

Figure 4:
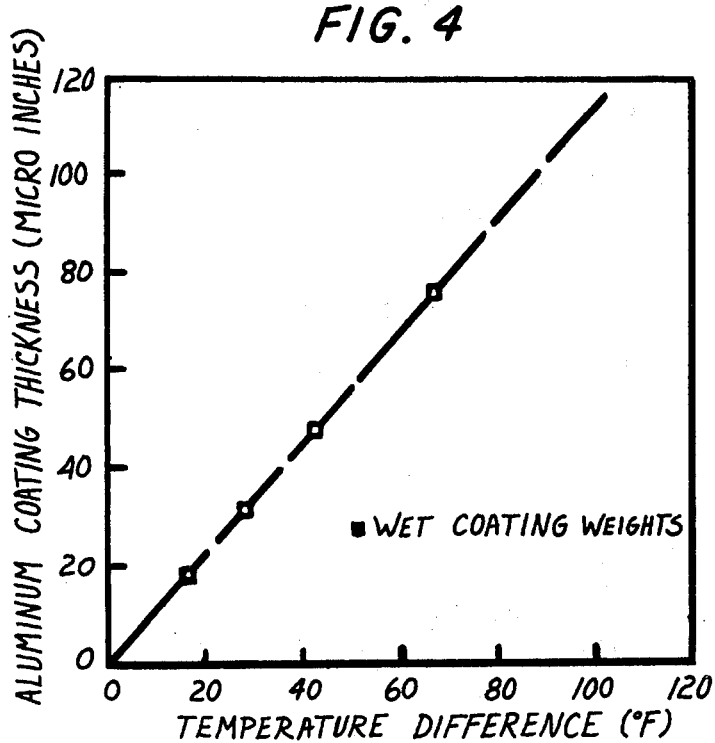
FIG. 4 is a graph showing the relation between the temperature difference above-mentioned and the coating thickness for an aluminum coating on a steel substrate.

While the heat balance equation could be amplified to include a term for heating of the substrate by radiation, it is simpler to measure the increase in temperature of the substrate caused by radiation from the crucible and subtract it from $T_f$. This is easily done by passing the substrate over an empty crucible heated to evaporation temperature and measuring the temperature difference with thermocouples 15 and 10, as has been described. This temperature difference is only a few degrees and is constant during a run. FIG. 4 is a graph of coating thickness of aluminum coating vapor deposited on steel strip of 0.018 inch thickness by the process of my invention under conditions such that radiation heating of the substrate is measurable. The substrate was moved over an aluminum vapor source at a temperature of 2700° F. at a speed of about 20 feet per minute. Radiation heating raised the substrate temperature 5° F. and the graph of FIG. 4 was obtained by subtracting that constant value of 5° F. from the temperature difference measured by the thermocouples during vacuum vapor coating. The points indicated on the graph are coating weights obtained by subtracting the weight of the substrate from which the coating was chemically stripped from the weight of the coated substrate. The aluminum coatings, which are quite thin, are seen to be linearly related to substrate temperature differences over the range of 20° to about 100° F.

I claim:

1. A method of vacuum vapor coating a thin metal substrate in strip form with a metal coating of a desired thickness without heating the substrate over about 1000° F comprising:

measuring the temperature of the substrate immediately before coating;

moving the substrate past a source which contains a pool of liquid coating metal which gives off metal vapor at its surface so as to condense coating metal on the substrate, to form a coating of said metal on said substrate, to supply heat to the substrate, and to increase the temperature of the substrate;

immediately thereafter measuring the increase in temperature of the substrate resulting therefrom under conditions where temperature equilibrium through the substrate thickness is reached in less than 0.1 second and substrate heat loss is negligible;

adjusting coating conditions to obtain the desired metal coating thickness in accordance with the equation, $$t_c \frac{C_{st}(T_f - T_o) \rho_{st} t_{st}}{\rho_c [C_k + C_c(T_c - T_f)]} \quad \text{where}$$

$t_c$ is the thickness of the coating in mils, $C_{st}$ is the average heat capacity of the substrate for temperatures between $T_o$ and $T_f$ in BTU's per pound per degree F., $T_f$ is the final temperature of the substrate immediately after coating in degrees F., $T_o$ is the temperature of the substrate immediately before coating in degrees F., $\rho_{st}$ is the density of the substrate in pounds per cubic inch, $t_{st}$ is the thickness of the substrate in mils, $\rho_c$ is the density of the coatng metal in pounds per cubic inch, $C_k$ is the heat of condensation of the coating metal at $T_c$ in BTU's per pound, $C_c$ is the average heat capacity of the solid coating metal for temperatures between $T_f$ and $T_o$ in BTU's per pound per degree F., and $T_c$ is the temperature of condensation of the coating metal in degrees F.; and measuring the increase in temperature of the substrate caused by radiation from the vapor source, subtracting said temperature increase caused by radiation from $T_f$, as defined above, to obtain a value, and using said value for $T_f$ in the equation.

2. The method of claim 1 in which the coating condition adjusted is the speed of the moving substrate.

3. The method of claim 1 in which the coating condition adjusted is the heat input to the source of coating metal vapor.

4. The method of claim 3 in which the source of coating metal vapor is a plurality of units aligned transversely of the path of travel of the substrate so that each unit supplies vapor to a separate portion of the substrate, and comprising separately measuring the temperatures of at least two portions of the substrate immediately before coating and immediately after coating and separately adjusting the heat inputs to each of the units to provide a predetermined ratio between the quantities $T_f - T_o$ for each portion of the substrate.

5. The method of claim 1 in which the metal substrate thickness is less than 0.05 inch.

6. The method of claim 1 in which measuring the increase in temperature of the substrate caused by radiation from the vapor source is accomplished by measuring the temperature difference before and after passing the substrate over an empty vapor source unit which has been heated to evaporation temperature.

7. The method of claim 1 in which the increase in temperature of the substrate is up to 350° F.

8. The method of claim 1 in which the metal coating comprises aluminum.

9. The method of claim 8 in which said steel substrate temperature increase minus said steel substrate temperature increase caused by radiation from the vapor source is from about 20° to about 100° F.

10. The method of claim 1 in which the metal coating comprises zinc.

11. The method of claim 1 in which the metal substrate comprises steel.

12. The method of claim 11 in which the metal coating comprises aluminum.

13. The method of claim 11 in which the metal coating comprises zinc.

* * * * *